US012598878B2

(12) United States Patent
Kim

(10) Patent No.: US 12,598,878 B2
(45) Date of Patent: Apr. 7, 2026

(54) LIGHT EMITTING DISPLAY APPARATUS

(71) Applicant: LG DISPLAY CO., LTD., Seoul (KR)

(72) Inventor: Jeong Ho Kim, Seoul (KR)

(73) Assignee: LG Display Co., Ltd. (KR)

( * ) Notice: Subject to any disclaimer, the term of this patent is extended or adjusted under 35 U.S.C. 154(b) by 597 days.

(21) Appl. No.: 17/985,959

(22) Filed: Nov. 14, 2022

(65) Prior Publication Data

US 2023/0217749 A1    Jul. 6, 2023

(30) Foreign Application Priority Data

Dec. 31, 2021    (KR) .......................... 10-2021-0194783

(51) Int. Cl.
H10K 59/131 (2023.01)
H10K 59/126 (2023.01)

(52) U.S. Cl.
CPC ......... H10K 59/131 (2023.02); H10K 59/126 (2023.02)

(58) Field of Classification Search
None
See application file for complete search history.

(56) References Cited

U.S. PATENT DOCUMENTS

| | | | |
|---|---|---|---|
| 2017/0062544 A1* | 3/2017 | Kang | H10K 59/131 |
| 2021/0159299 A1 | 5/2021 | Wang et al. | |
| 2022/0131110 A1* | 4/2022 | Ishizuya | H10K 59/8792 |

| | | | |
|---|---|---|---|
| 2022/0140036 A1* | 5/2022 | Lee | H10K 59/1213 |
| | | | 257/40 |
| 2024/0016006 A1* | 1/2024 | Chen | H10K 59/351 |
| 2024/0397763 A1* | 11/2024 | Cai | H10K 59/126 |

FOREIGN PATENT DOCUMENTS

| | | |
|---|---|---|
| CN | 109887985 A | 6/2019 |
| KR | 20060090484 A | 8/2006 |
| KR | 20150127968 A | 11/2015 |
| KR | 20170124679 A | 11/2017 |
| KR | 10-2018-0025488 A | 3/2018 |
| KR | 20180062897 A | 6/2018 |
| KR | 10-2018-0125084 A | 11/2018 |
| KR | 20200055177 A | 5/2020 |

OTHER PUBLICATIONS

Office Action in Korean Appln. No. 10-2021-0194783, mailed on Aug. 13, 2025, 14 pages (with English translation).
Office Action in Chinese Appln. No. 202211444130.5, mailed on May 29, 2025, 15 pages (with English translation).

* cited by examiner

*Primary Examiner* — Nilufa Rahim
(74) *Attorney, Agent, or Firm* — Fish & Richardson P.C.

(57) ABSTRACT

A light emitting display apparatus according to an aspect of the present disclosure may include a first driving transistor and a second driving transistor spaced apart from each other on a substrate, a first anode connected to the first driving transistor and overlapping with the second driving transistor, a second anode connected to the second driving transistor, and a shielding metal between the second driving transistor and the first anode. The second anode may have a smaller area than the first anode, and the shielding metal may reduce a parasitic capacitance associated with the second anode and the first anode.

20 Claims, 7 Drawing Sheets

LIGHT EMITTING DISPLAY APPARATUS

CROSS-REFERENCE TO RELATED APPLICATION

This application claims the benefit of Korean Patent Application No. 10-2021-0194783, filed on Dec. 31, 2021, which is hereby incorporated by reference as if fully set forth herein.

BACKGROUND

Field of the Disclosure

The present disclosure relates to a light emitting display apparatus.

Description of the Background

Display apparatuses are applied to various fields including personal portable apparatuses and apparatuses mounted in vehicles as well as computer monitors and TVs. Accordingly, display apparatuses are implemented in various shapes (e.g., an ellipse) (hereinafter referred to as "different shapes") in addition to conventional rectangular shapes.

In addition, as a display apparatus, a display apparatus requiring self-luminous such as a light emitting display apparatus has recently been demanded.

In a self-luminous display apparatus, light emitting elements emit light without an additional light source. Various methods for optimizing the use of light by diversifying the arrangement of light emitting elements have been proposed.

In a light emitting display apparatus, there may be a difference in size of sub-pixels, the difference in size of sub-pixels may cause an anode of one color to overlap a transistor of another color. The overlapping of an anode and a transistor can create a parasitic coupling in the overlapped area between the anode of one color and the transistor of another color.

SUMMARY

In order to prevent a parasitic coupling between different size sub-pixels, in a light emitting display apparatus of a present disclosure, a shielding metal may be formed at an overlapped portion between an anode of one color and a transistor of another color, at neighboring sub-pixels.

A shielding metal may be formed to prevent electrical coupling due to overlapping of an anode emitting light in a first color and a neighboring driving transistor for a light emitting element in a second color in a predetermined region.

A light emitting display apparatus according to an embodiment of the present disclosure may include a first driving transistor and a second driving transistor spaced apart from each other on a substrate, a first anode connected to the first driving transistor and overlapping with the second driving transistor, a second anode having a smaller area than the first anode and connected to the second driving transistor, and a shielding metal between the second driving transistor and the first anode.

DETAILED DESCRIPTION

Figure 1:
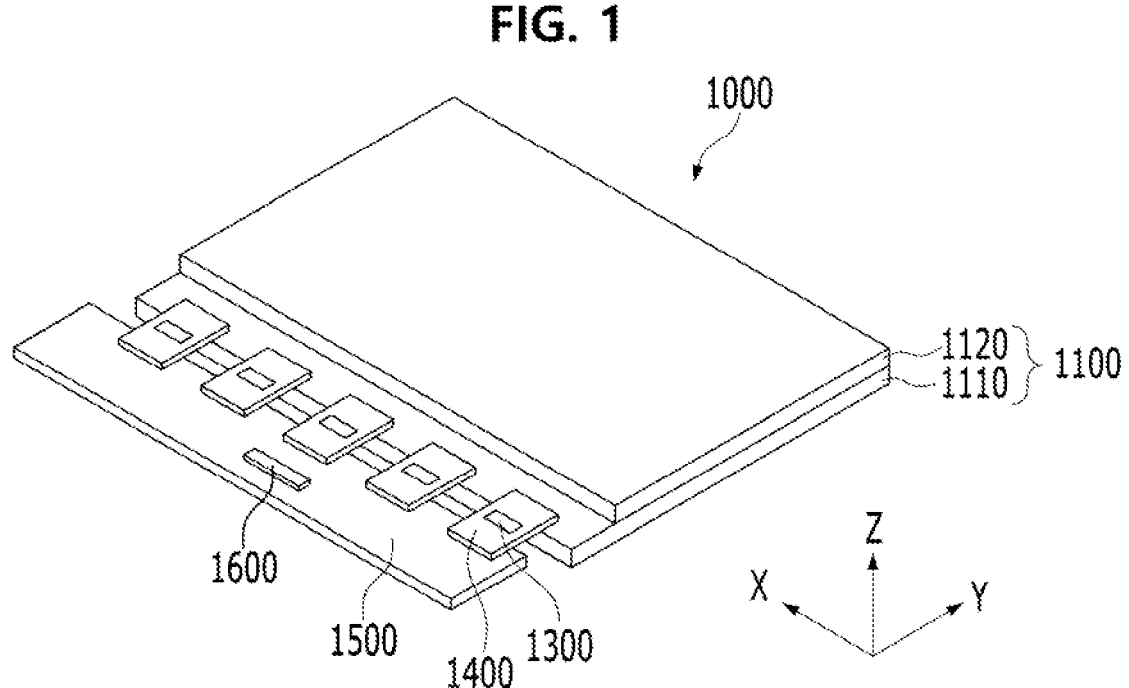
FIG. 1 is a perspective view showing a light emitting display apparatus according to an aspect of the present disclosure.

Hereinafter, aspects of the present disclosure will be described with reference to the attached drawings. The same reference numbers will be used throughout this specification to refer to the same or like parts. In the following description of the present disclosure, a detailed description of known functions and configurations incorporated herein will be omitted when it may obscure the subject matter of the present disclosure. In addition, the component names used in the following description are selected in consideration of the ease of writing the specification and may be different from the part names of the actual products.

In the drawings for explaining the exemplary aspects of the present disclosure, for example, the illustrated shape, size, ratio, angle, and number are given by way of example, and thus, are not limited to the disclosure of the disclosure. Throughout the present disclosure, the same reference numerals designate the same constituent elements. In addition, in the following description of the present disclosure, a detailed description of known functions and configurations incorporated herein will be omitted when it may make the subject matter of the present disclosure rather unclear. The terms "comprises", "includes" and/or "has", used in this specification, do not preclude the presence or addition of other elements unless it is used along with the term "only". The singular forms are intended to include the plural forms as well, unless the context clearly indicates otherwise.

In interpreting a component, it is interpreted as including an error range even if there is no separate explicit description.

When describing positional relationships, for example, when the positional relationship between two parts is described using "on", "above", "below", "aside", or the like, one or more other parts may be located between the two parts unless the term "directly" or "closely" is used.

In the description of the various aspects of the present disclosure, when describing temporal relationships, for example, when the temporal relationship between two actions is described using "after", "subsequently", "next", "before", or the like, the actions may not occur in succession unless the term "directly" or "just" is used.

In the following description of the embodiments, "first" and "second" are used to describe various components, but such components are not limited by these terms. The terms are used to discriminate one component from another component. Accordingly, a first component mentioned in the following description may be a second component within the technical spirit of the present disclosure.

The respective features of the various aspects of the present disclosure may be partially or wholly coupled to and combined with each other, and various technical linkage and driving thereof are possible. These various aspects may be performed independently of each other, or may be performed in association with each other.

Although an organic light emitting display apparatus will be mainly described below as a light emitting display apparatus according to an aspect of the present disclosure, the material used to form light emitting elements in the display apparatus is not limited to organic materials. In some cases, a light emitting material may be an organic material, an inorganic material such as quantum dots or nitride semiconductor, or a synthetic material of an organic material and an inorganic material such as perovskite.

The terms that will be described later are terms defined in consideration an implementation of the present disclosure, which may vary according to intentions or customs of users and operators. The definition of the terms should be made based on this specification.

A transistor constituting a pixel circuit in the present disclosure may include at least one of an oxide thin film transistor (TFT), an amorphous silicon TFT (a-Si TFT), and a low temperature poly silicon (LTPS) TFT.

The following exemplary aspects will be described based on an organic light emitting display. However, the aspects of the present disclosure are not limited to the organic light emitting display apparatus and may be applied to an inorganic light emitting display apparatus including an inorganic light emitting material. For example, the aspects of the present disclosure may also be applied to a quantum dot display apparatus.

Expressions such as "first", "second", and "third" are terms used to distinguish configurations in embodiments, and the aspects are not limited to these terms. Therefore, it should be noted that even the same term may refer to different components according to embodiments. For example, the first sub-pixel circuit of FIG. 1 and the first sub-pixel circuit of FIG. 2 are terms for distinguishing the components in the figures and may not refer to the same component.

Hereinafter, aspects of the present disclosure will be described with reference to the drawings.

Figure 2:
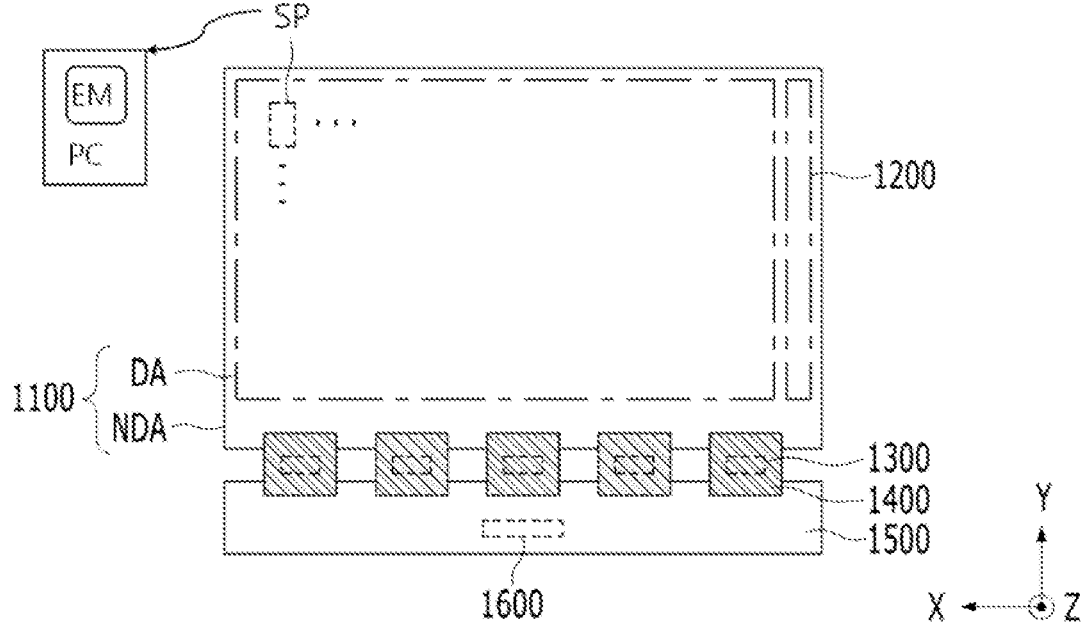
FIG. 2 is a plan view showing a substrate shown in FIG. 1.

FIG. 1 is a block diagram of a display apparatus according to an aspect of the present disclosure.

An electroluminescent display may be used as a display apparatus 1000 according to an aspect of the present disclosure. As the electroluminescent display, an organic light emitting diode display apparatus, a quantum dot light emitting diode display apparatus, or an inorganic light emitting diode display apparatus may be used.

FIG. 1 is a perspective view of a light emitting display apparatus according to the present disclosure, and FIG. 2 is a plan view of a substrate in FIG. 1.

As shown in FIGS. 1 and 2, the light emitting display apparatus 1000 of the present disclosure may include a display panel 1100, a scan driver 1200, a flexible film 1400 including a data driver, a circuit board 1500, and a timing controller 1600. The flexible film 1400 may include a data driver 1300 to drive the signal lines (e.g., scan lines 162 and 164). As illustrated, the flexible film 1400 may supply a data signal to each of several divided blocks of a plurality of signal lines included in the display panel 1100 and detect a sensing signal therefrom, or may correspond to all of the signal lines and function as the data driver. In some cases, the flexible film 1400 and the circuit board 1500 may be integrated.

The display panel 1100 may include an array substrate 1110 and a counter substrate 1120. The array substrate 1110 and the counter substrate 1120 include a glass or plastic substrate, and may further include a thin film transistor array, a color filter array, or an optical film on the substrate. For example, when the array substrate 1110 includes a plastic substrate, the plastic forming the substrate may be polyimide, polyethylene terephthalate (PET), polyethylene naphthalate (PEN), or polycarbonate (PC). When the array substrate 1110 includes a plastic substrate, the light emitting display apparatus 1000 may be implemented as a flexible display apparatus that can be curved or bent. The counter substrate 1120 may include any one of glass, a plastic film, and an encapsulation film. When the counter substrate 1120 is an encapsulation film, the encapsulation film may have a unit structure including an organic film and an inorganic film which are alternately provided, and may be directly formed on the array substrate 1110 without a bonding process for bonding to the array substrate 1110.

The array substrate 1110 is a thin film transistor substrate on which thin film transistors are formed. Scan lines, signal lines, and sub-pixels SP are formed on one surface of the array substrate 1110 facing the counter substrate 1120. The sub-pixels SP are provided in regions defined by an intersection structure of the scan lines and the signal lines. The scan lines are connected to the scan driver 1200, and the signal lines are connected to the data driver 1300. Further, as illustrated, the scan driver 1200 may be directly embedded in a non-display area NDA of the array substrate 1110 or may be connected to the non-display area NDA of the array substrate 1110 through a separate drive IC or printed circuit film.

As shown in FIG. 2, the display panel 1100 may be divided into a display area DA in which the sub-pixels SP are formed to display an image and the non-display area NDA in which an image is not displayed. The scan lines, signal lines, and sub-pixels SP may be formed in the display area DA. The scan driver 1200, pads, and link lines connecting signal lines and the pads may be formed in the non-display area NDA.

Each sub-pixel SP may be divided into a light emitting part EM in which light is substantially emitted and a pixel circuit part PC including wirings and transistors, which is provided outside the light emitting part.

In addition, the pixel circuit part PC in the sub-pixel SP may include a plurality of transistors as switching elements to be turned on by a scan signal of a scan line to receive a data voltage of a signal line, and each transistor may be a thin film transistor. The transistors in the sub-pixel SP may have the same stack structure in which they have active layers in the same layer, or may have a heterogeneous stack structure in which active layers are formed in different layers.

Figure 3:
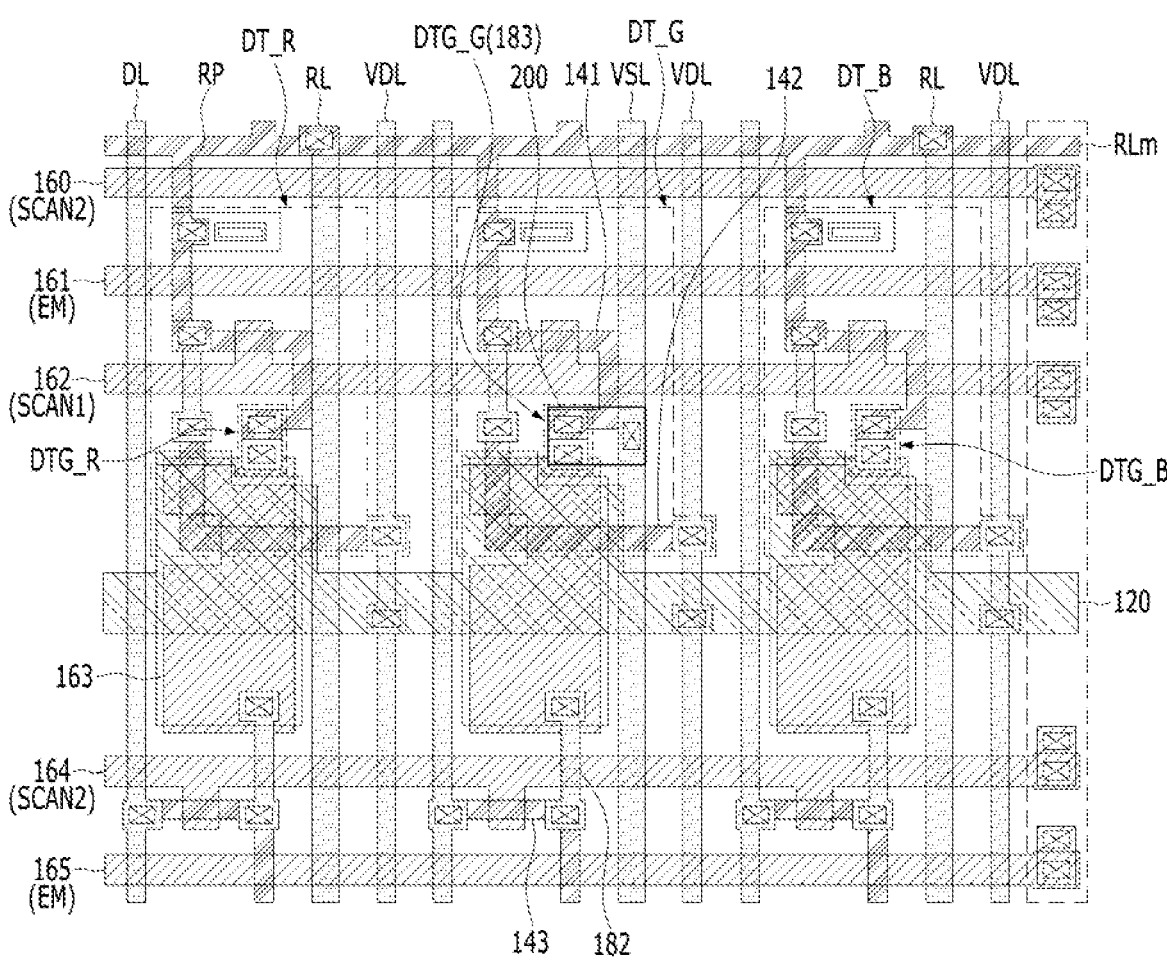
FIG. 3 is a plan view showing a configuration of a thin film transistor array in a part of a light emitting display apparatus according to an aspect of the present disclosure.
Figure 4:
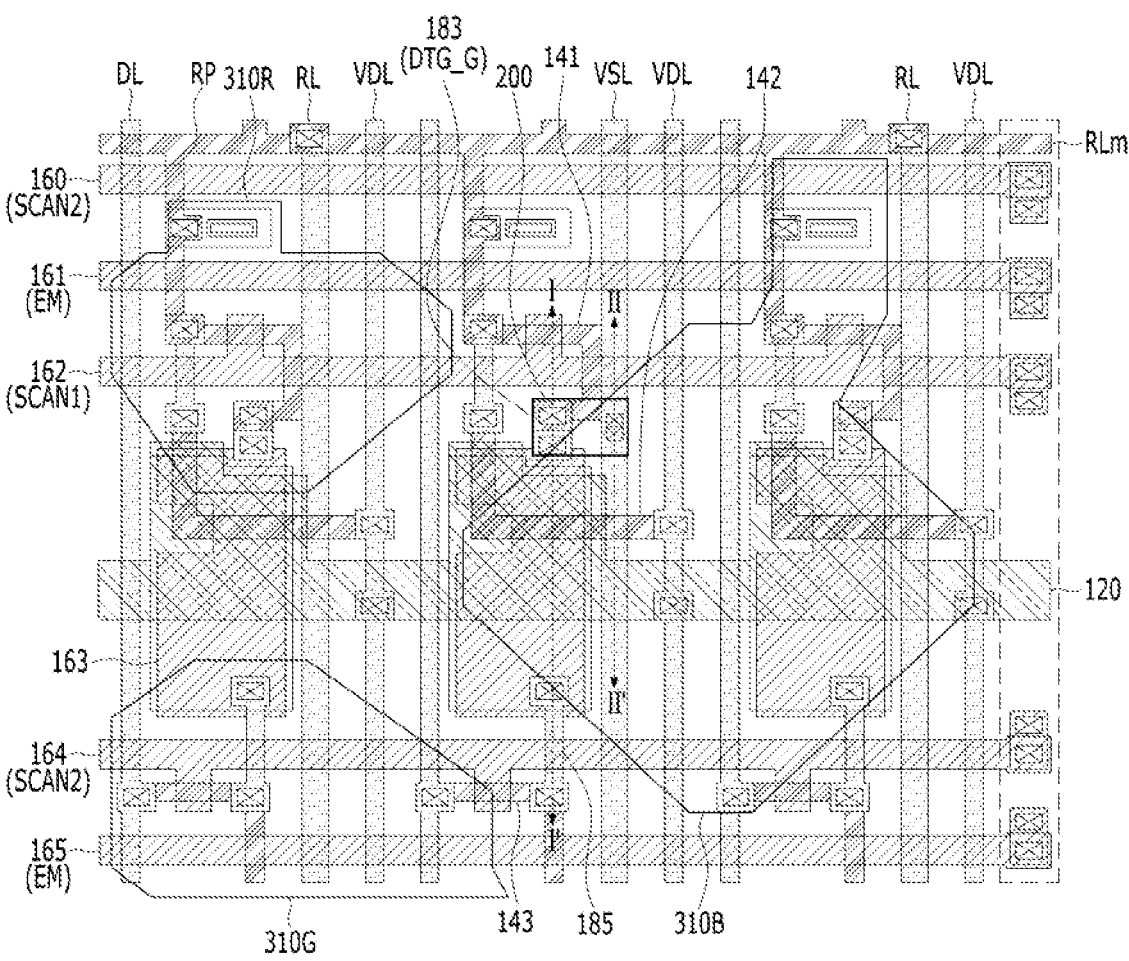
FIG. 4 is a plan view showing an anode shown in FIG. 3.
Figure 5:
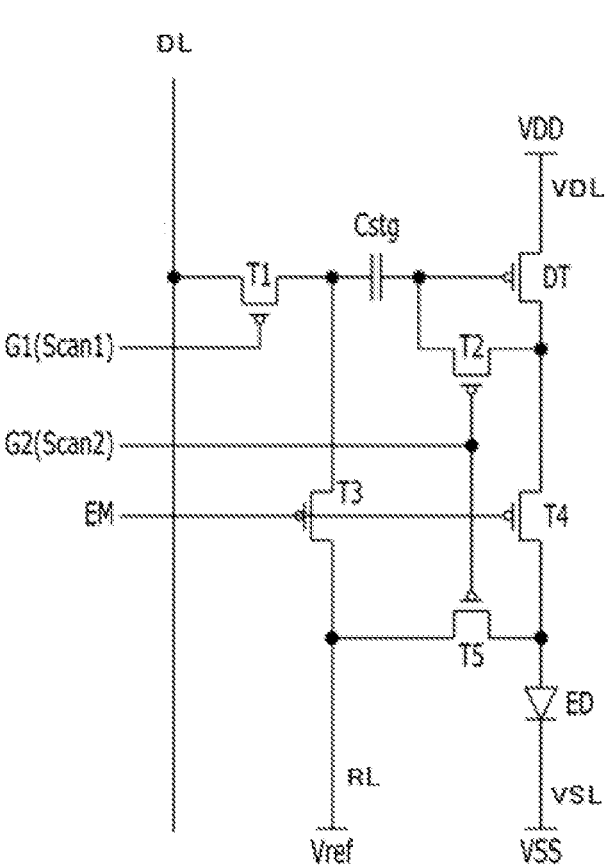
FIG. 5 is a circuit diagram of a sub-pixel according to an aspect of the present disclosure.
Figure 6:
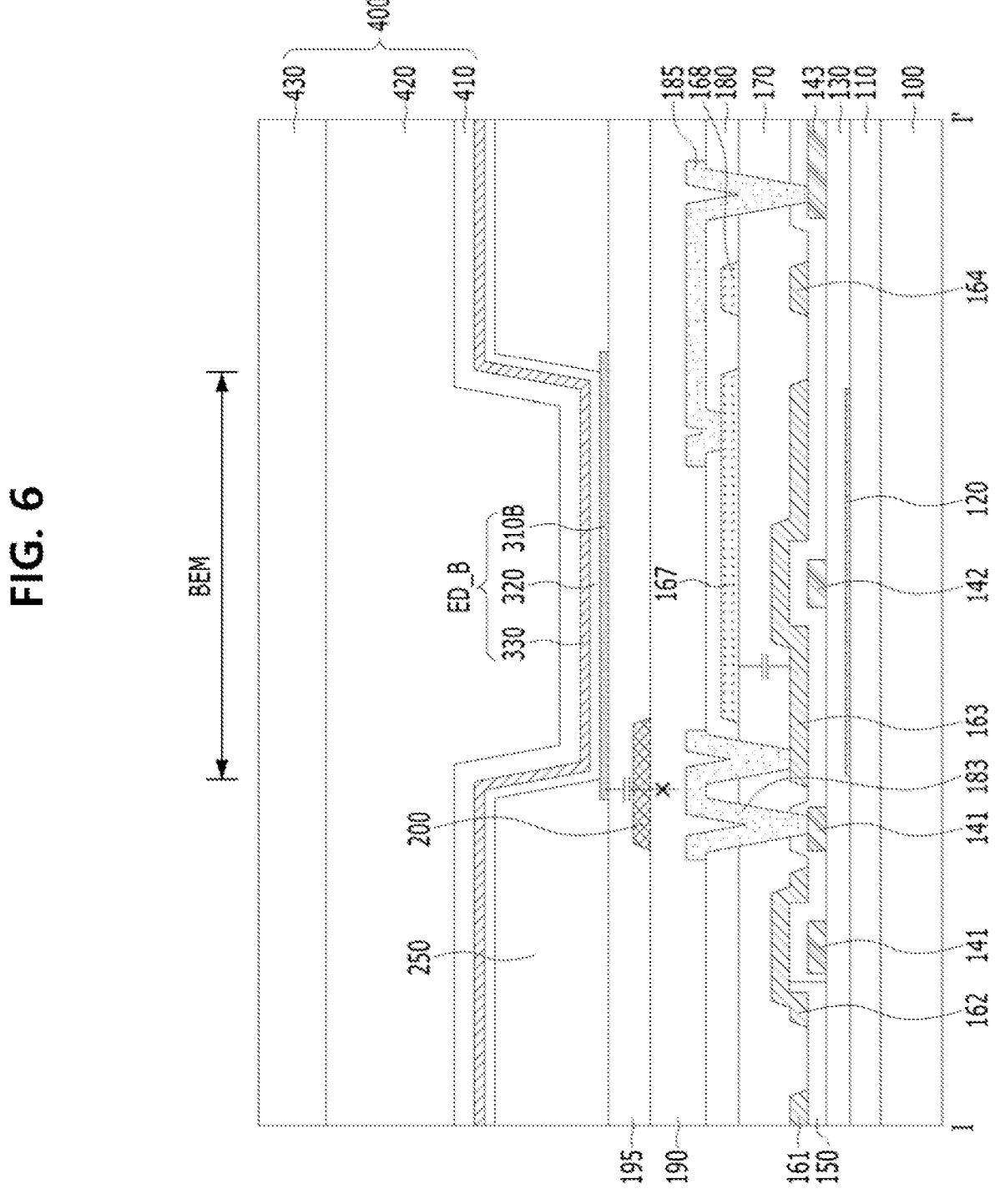
FIG. 6 is an exemplary cross-sectional view taken along line I-I' of FIG. 4.
Figure 7:
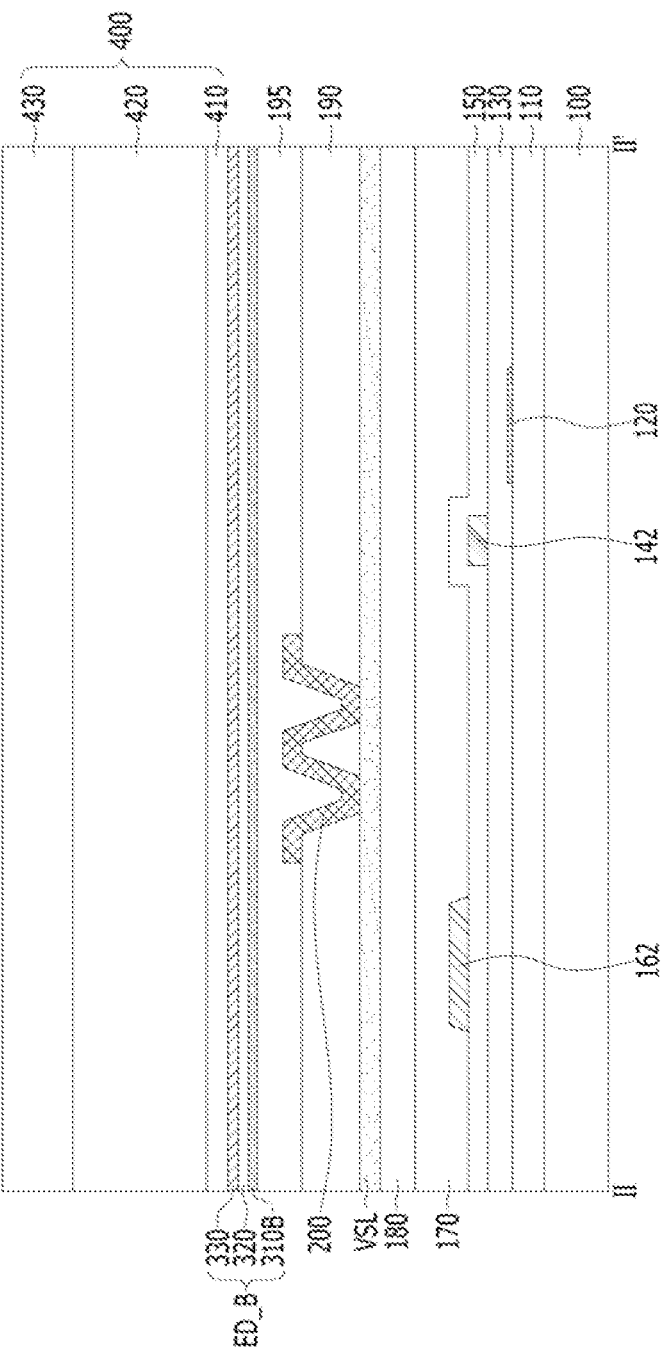
FIG. 7 is an exemplary cross-sectional view taken along line II-IF of FIG. 4.

FIG. 3 is a plan view showing a configuration of a thin film transistor array in a part of the light emitting display apparatus of the present disclosure. FIG. 4 is a plan view showing an anode in FIG. 3. FIG. 5 is a circuit diagram of a sub-pixel according to an aspect of the present disclosure. FIG. 6 is a cross-sectional view taken along line I-I' of FIG. 4, and FIG. 7 is a cross-sectional view taken along line II-II' of FIG. 4.

FIG. 3 is a plan view showing a configuration of the thin film transistor array including transistors and storage capacitors. FIG. 4 shows anodes 310R, 310G, and 310B of light emitting elements, more specifically, a red light emitting element, a green light emitting element, and a blue light emitting element OLED B on the thin film transistor array.

As shown in FIG. 3, the thin film transistor array includes data lines DL, a first power line VSL through which a low-level VSS power voltage is transmitted, a second power line VDL through which a high-level VDD power voltage is transmitted, and a third power line RL through which a reference voltage is transmitted as an initialization voltage, which are parallel. The third power line RL for transmitting the reference voltage is connected to a mesh pattern reference line RLm provided in the form of a mesh in the display area DA of the substrate 100, which intersects the third power line RL in the vertical direction and thus may supply the same reference voltage as the third power line RL.

In addition, scan lines 162 and 164 and a light emission control line EM may be provided in a direction crossing the first power line VSL, the second power line VDL, the third power line RL, and the data line DL.

The first power line VSL, the second power line VDL, the third power line RL and the data line DL, the scan lines 162 and 164, and the light emission control line EM in the intersecting direction may be connected to switching transistors T3 and T4 and a driving transistor DT of the sub-pixel shown in FIG. 5, which is an example of a sub-pixel.

The driving transistor DT is provided across the light emission control line EM and the scan line 162 with an active layer 141 interposed therebetween. In one illustrative aspect, the driving transistor DT includes a driving gate electrode DTG_R, DTG_G, or DTG_B.

As shown in FIG. 3, the sub-pixels formed in the thin film transistor array process may have the same circuit configuration, but the light emitting elements that emit light may have different areas as shown in FIG. 4. Accordingly, the area for each color may be differently adjusted according to the visibility required for the display apparatus. FIG. 4 shows an example in which a blue anode 310B included in a blue light emitting element has a larger area than a green anode 310G and a red anode 310R. The larger area of the blue anode 310B can be configured to compensate for the low visibility of blue light that is emitted from a light emitting area, but the present disclosure is not limited thereto. Other techniques to increase visibility of blue light include disposing a larger number of blue light emitting elements than light emitting elements of other colors or controlling light emitting intensity in a circuit.

In this aspect, the blue anode 310B is positioned to partially overlap with the gate electrode DTG_G 183 of the green driving transistor DTG that is electrically connected to the green anode 310G. In this case, when the blue anode 310B is turned on, a parasitic coupling may occur between the gate electrode DTG_G 183 of the green driving transistor DTG and the blue anode 310B. When the blue anode 310B is normally turned on, the parasitic capacitance causes the luminance of the green light emitting element to decrease. In addition, when the blue light emitting element is darkened, a bright spot defect, which is a phenomenon in which the green driving gate electrode DTG_G overlapping with the darkened blue anode is brighter than the green light emitting element, overlapping with another normal blue anode 310B occurs. For example, a bright spot defect can occur when a parasitic capacitance is formed based on the gate electrode DTG_G of a green light emitting element overlaps a normal blue anode 310B. The parasitic capacitance may cause a darkened blue light emitting element to be brighter than the green light emitting element.

In the light emitting display apparatus of the present disclosure, as shown in FIG. 6, a shielding metal 200 is provided between the gate electrode DTG_G 183 of the green driving transistor DTG and the blue anode 310B to prevent parasitic coupling therebetween.

In addition, the shielding metal 200 is connected to the first power line VSL, which is a low-level power line passing through the display area, and applies a constant voltage at a low level to the shielding metal 200. Even when a turn-on voltage is applied to the blue anode 310B overlapping with the shielding metal 200, the shielding metal 200 is not affected by the turn-on voltage.

In the light emitting display apparatus according to an aspect of the present disclosure, the anodes 310R, 310G, and 310B of the light emitting elements ED include a reflective electrode and the overlapping between the anodes on the lower thin film transistor array does not affect light emitting characteristics. Accordingly, light emitting regions may have different areas for respective colors.

Although the illustrated example shows that the blue anode 310B has a large area and partially overlaps with the green driving gate electrode DTG_G, the aspect of the present disclosure is not limited thereto. In some cases, the green anode or the red anode may overlap with a driving transistor or a switching transistor of a different color, and a shielding metal can be formed between two overlapping metals to prevent the influence of overlapping metals.

For example, the green driving transistor DTG may include a gate electrode DTG_G, an active layer 142, a source electrode DTG S, and a drain electrode DTG D. The gate electrode DTG_G of the green driving transistor DTG may overlap with the blue anode 310B and the shielding metal 200 to prevent electrical coupling therebetween.

The first power line VSL may be parallel to the data line DL and may overlap with the blue anode 310B.

In one aspect, the shielding metal 200 may be disposed between a first planarization layer 190 and a second planarization layer 195, and the first planarization layer 190 and the second planarization layer 195 may be disposed between the green driving gate electrode DTG_G and the blue anode 310B.

In some cases, the shielding metal 200 may have an area equal to or greater than the overlapping area between the blue anode 310B and the driving gate electrode DTG_G 183 of the green driving transistor DTG and prevents a parasitic capacitance forming between the gate electrode DTG_G 183 of the green driving transistor DTG and the blue anode 310B.

In an embodiment, the shielding metal 200 may include the same material (e.g., titanium (Ti) or aluminum (Al)) as the source electrodes of driving transistors included in the light emitting display apparatus, but is not limited thereto. For example, the shielding metal may include molybdenum (Mo).

In one aspect, the shielding metal 200 includes the same material as the source electrodes, the shielding metal 200 may be formed in a three-layer structure in which titanium, aluminum, and titanium are sequentially laminated.

In another aspect, the thickness of the shielding metal 200 may be the same as that of the source electrodes within an error range.

A bank 250, which is illustrated in FIG. 6, may be provided with light emitting parts of the blue anode 310B, the green anode 310G, and the red anode 310R exposed. The bank 250 can be formed to overlap light emitting elements, such as the edge of each of the anodes 310G, 310R, and 310B, the anode 310G, 310R, and 310B of the light emitting parts. As illustrated in FIG. 6, an organic layer 320 and a cathode 330 may be provided on the bank 250. For example, a blue light emitting element ED_B includes the blue anode 310B, the organic layer 320, and the cathode 330. The organic layer 320 and the cathode 330 may be formed over the entire display area (refer to DA in FIG. 1), and the areas of the light emitting parts EM are defined as the anodes 310R, 310G, and 310B exposed through the bank 250.

The anodes 310R, 310G, and 310B are on the same layer and include a reflective electrode to prevent the lower wiring configuration from being visible.

The light emitting display apparatus of the present disclosure includes the shielding material provided between an anode of one color (e.g., red, green, or blue, etc.) and a driving gate electrode in a different color. For example, when the anode and the driving gate electrode overlap, the shielding prevents the formation of a parasitic capacitance.

FIG. 5 shows a circuit configuration of the sub-pixel SP of the display apparatus according to an aspect of the present disclosure.

Each sub-pixel SP may include first to fifth switching transistors T1 to T5, a driving transistor DT, a storage capacitor Cstg, and a light emitting element ED.

In this aspect, the light emitting element ED may be a self-luminous apparatus capable of spontaneously emitting light, such as an organic light emitting diode, but is not limited thereto.

In the sub-pixel SP according to the aspect of the present disclosure, the first to fifth switching transistors T1 to T5 and the driving transistor DT may be P-type transistors. However, the present disclosure is not limited thereto, and in some cases, at least one of the first to fifth switching transistors T1 to T5 and the driving transistor DT may be an N-type transistor.

In other aspects, positions of the source and drain of a transistor which will be described later may be changed.

A P-type transistor can be more reliable than an N-type transistor for some configuration and some materials. In the case of the P-type transistor, since the source electrode is fixed to the high-level driving voltage VDD, the current flowing in the light emitting element ED is not affected by the capacitor Cstg. Therefore, it is easy to supply current stably.

For example, a P-type transistor may be connected to the anode of the light emitting element ED. When the transistors T4 and T5, which are connected to the light emitting element ED, operate in a saturation region, a constant current can flow regardless of changes in the current and threshold voltage of the light emitting element ED, and thus reliability is relatively high.

In one aspect, a transistor may be a silicon transistor that formed with a semiconductor such as silicon (e.g., a transistor having a polysilicon channel formed using a low temperature process such as low temperature polysilicon or LTPS). However, the transistor is not limited thereto, and in some cases, the transistor may be an oxide transistor. The oxide transistor has a relatively lower leakage current than the silicon transistor, and current leakage from the gate electrode of the driving transistor DT can be prevented when the transistor is implemented using the oxide transistor, and image quality deterioration such as flicker can be reduced.

The gate electrode of the first switching transistor T1 may receive a first scan signal Scan1. The source electrode of the first switching transistor T1 may receive a data voltage Vdata. The drain electrode of the first switching transistor T1 may be connected to the storage capacitor Cstg.

The gate electrode of the second switching transistor T2 may receive a second scan signal Scan2. The second switching transistor T2 is turned on by the second scan signal Scan2 to control the operation of the driving transistor DT through the high-level driving voltage VDD stored in the storage capacitor Cstg.

The gate electrode of the third switching transistor T3 may receive a light emission signal from the light emission control line EM. The source electrode of the third switching transistor T3 may receive a reference voltage Vref.

The gate electrode of the fourth switching transistor T4 may receive the light emission signal from the light emission control line EM. The source electrode of the fourth switching transistor T4 may be connected to the drain electrode of the driving transistor DT. The drain electrode of the fourth switching transistor T4 may be connected to the anode of the light emitting element ED. The fourth switching transistor T4 is turned on by the light emission signal from the light emission control line EM to supply a driving current to the anode of the light emitting element ED.

The gate electrode of the fifth switching transistor T5 may receive the second scan signal Scan2. The source electrode of the fifth switching transistor T5 may receive the reference voltage Vref through the third power line RL. The drain electrode of the fifth switching transistor T5 may be connected to the anode of the light emitting element ED.

The gate electrode of the driving transistor DT may be connected to the storage capacitor Cstg, and the drain electrode thereof may be connected to the source electrode of the second switching transistor T2. The source electrode of the driving transistor DT may receive the high-level driving voltage VDD.

The anode of the light emitting element ED is connected to the drain electrode of the fifth switching transistor T5 and the drain electrode of the fourth switching transistor T4. The low-level driving voltage VSS may be supplied to the cathode of the light emitting element ED.

In one aspect, the fourth switching transistor T4 is positioned between the anode of the light emitting element ED and the driving transistor DT, and the fourth switching transistor T4 is controlled by the light emission signal from the light emission control line EM. When the reference voltage Vref is supplied to the anode of the light emitting element ED when the fourth switching transistor T4 is turned off, the anode of the light emitting element ED may be reset.

In FIG. 5, a sub-pixel SP including six transistors DT, T1, T2, T3, T4, and T5 and a capacitor Cstg is illustrated as an example. However, the present disclosure is not limited thereto, and the structures and numbers of transistors and capacitors constituting the sub-pixel SP may be changed. Further, in an other aspects, the plurality of sub-pixels SP may have the same structure, or some of the plurality of sub-pixels SP may have a different structure.

The layered structure of the blue light emitting part will be described in detail with reference to FIGS. 6 and 7.

A buffer layer 110 is provided on a substrate 100.

Then, a lower light blocking metal 120 is formed on at least a portion of the buffer layer 110 corresponding to where the active layer 142 used as a channel will be formed. As shown in FIGS. 3 and 4, the lower light blocking metal 120 may be connected to the second voltage line VDL in a subsequent process and stabilized by being provided with a constant high-level voltage signal.

Then, an active buffer layer 130 is formed on the lower light blocking metal 120.

Next, active layers 141, 142, and 143 are formed and then patterned to remain in predetermined regions.

FIGS. 3 and 4 show examples in which conductive active layers are used for the mesh pattern reference line RLm and other connection patterns.

A gate insulating layer 150 is formed on the active layers 141, 142, and 143, and then a first storage electrode 163, a first scan line (Scan1) 162, second scan lines (Scan2) 160 and 164, and light emission control lines (EM) 161 and 165 are formed.

Next, a first interlayer insulating layer 170 covering the first and second scan lines Scan1 and Scan2 and the light emission control line EM is formed.

Next, a second storage electrode 167 overlapping with the first storage electrode 163 is formed. An upper metal 168 may be further formed in the same process.

Next, a second interlayer insulating layer 180 is formed.

Next, a green driving gate electrode 183 connected to the conductive active layer 141 and the first storage electrode 163 are formed, and in the same process, a connection pattern 185 to which the second storage electrode 167 is connected is formed.

Next, a first planarization layer 190 covering the green driving gate electrode 183 and the connection pattern 185 is formed.

Next, a shielding metal 200 may be formed on the first planarization layer 190. The shielding metal 200 may contact the first power line VSL by a contact hole in the first planarization layer 190.

A second planarization layer 195 that covers the shielding metal 200 is formed.

In addition, a blue anode 310B is formed to overlap with the shielding metal 200 at a portion where the green driving gate electrode 183 is located. Next, a bank 250 covering the edge of the blue anode 310B and exposing a blue light emitting part BEM is formed.

A blue light emitting element ED_B is formed in the blue light emitting part BEM includes the blue anode 310B, an organic layer 320, and a cathode 330.

In some cases, the organic layer 320 may further include a hole injection layer, a hole transport layer, an emission layer, an electron transport layer, and an electron injection layer. The emission layer may be selectively formed to correspond to the light emitting part BEM, and other layers may be formed in the entire display area DA.

In some aspects, an encapsulation structure 400 may be formed to cover the light emitting element ED. The encapsulation structure 400 is obtained by alternately forming inorganic encapsulation films 410 and 430 and organic encapsulation films 420. The inorganic encapsulation films 410 and 430 are formed to prevent moisture permeation, and the organic encapsulation film 420 is provided to prevent the flow of particles generated during the process and to prevent defects caused thereby.

When the anode includes a reflective electrode, the shape of the anode may be not affected by the shape of the lower wiring or circuit configuration. However, when the area of the anode in a specific color is large and overlaps with a driving transistor for operation for representation of a different color, there is a risk of a parasitic coupling occurring in the overlapping region.

The light emitting display apparatus according to aspects of the disclosure includes a shielding metal between an anode of a specific color and a driving gate electrode of a different color that prevents the driving gate electrode of a different color from being affected by a turn-on operation of the anode of the specific color. In addition, when a sub-pixel of the specific color functions as an abnormal sub-pixel due to a short-circuit between the anode and the cathode, the shield metal blocks a phenomenon in which a brightness increases in a different sub-pixel including a driving gate electrode overlapped with the anode of the abnormal sub-pixel. If there is no shielding metal between the anode of the specific color and the driving gate electrode of the different color, in the sub-pixel of the different color including the driving gate electrode overlapped with the anode of the abnormal sub-pixel of the specific color, a brightness may be relatively increased than other sub-pixels emitting the different color (having the driving gate electrode overlapped with the anode of normal sub-pixel) and a bright spot may be observed.

The shielding metal can be formed to prevent an electrical coupling due to overlapping of an anode emitting light in a first color and a neighboring driving transistor for a light emitting element in a second color in a predetermined region.

A light emitting display apparatus according to an aspect of the present disclosure may include a first driving transistor and a second driving transistor spaced apart from each other on a substrate, a first anode connected to the first driving transistor and overlapping with the second driving transistor, a second anode having a smaller area than the first anode and connected to the second driving transistor, and a shielding metal between the second driving transistor and the first anode.

The second driving transistor may include a gate electrode, an active layer, a source electrode, and a drain electrode, and the gate electrode of the second driving transistor may overlap with the first anode and the shielding metal.

The shielding metal may be connected to a first power line.

The first power line may be parallel to a data line and overlap with the first anode.

The shielding metal may be between a first planarization layer and a second planarization layer, and the first planarization layer and the second planarization layer may be interposed between the gate electrode and the first anode.

The shielding metal may have an area greater than an overlapping area of the first anode and the gate electrode.

A light emitting display apparatus according to an aspect of the present disclosure may further include a bank exposing light emitting parts of the first anode and the second anode, and overlapping with the edges of the first anode and the second anode. An organic layer and a cathode may be provided on the first anode and the second anode of the light emitting parts, and the bank.

The first anode and the second anode may be disposed on the same layer, and at least one of the first anode and the second anode may include a reflective electrode.

The first anode and the second anode may correspond to light emitting parts of different colors.

A light emitting display apparatus according to another aspect of the present disclosure may include a first driving transistor and a second driving transistor spaced apart from each other on a substrate, a first anode connected to the first driving transistor and overlapping with the second driving transistor, the first anode including a blue light emitting part, a second anode spaced apart from the first anode and connected to the second driving transistor, the second anode including a green light emitting part, and a shielding metal between the second driving transistor and the first anode.

The first anode may have a larger area than the second anode.

The second driving transistor may have a gate electrode, an active layer, a source electrode, and a drain electrode, and the gate electrode of the second driving transistor may overlap with the first anode and the shielding metal.

The shielding metal may be connected to a first power line.

The first power line may be parallel to a data line and overlap with the first anode.

The shielding metal may be between first and second planarization layers, and the first planarization layer and the second planarization layer may be interposed between the gate electrode and the first anode.

The shielding metal may have a larger area than an overlapping area of the first anode and the gate electrode.

The light emitting display apparatus may further include a bank exposing the blue light emitting part and the green light emitting part, and overlapping with edges of the first anode and the second anode. An organic layer and a cathode may be provided on the first anode, the second anode, and the bank.

The first anode and the second anode may be disposed on the same layer, and at least one of the first anode and the second anode may include a reflective electrode.

The present disclosure described above is not limited to the above-described aspects and the accompanying drawings, and those skilled in the art will appreciate that various substitutions, modifications and variations can be made in the present disclosure without departing from the spirit or scope of the disclosure.

The light emitting display apparatus of the present disclosure has the following effects.

When the anode includes a reflective electrode, the shape of the anode may be not affected by the shape of the lower wiring or circuit configuration. However, when the area of the anode in a specific color is large and thus overlaps with a driving transistor for operation for representation of a different color, there is a risk of a parasitic coupling occurring in the overlapping region.

The light emitting display apparatus of the present disclosure solves this problem, and provides a shielding metal between an anode in a specific color and a driving gate electrode in a different color to prevent the driving gate electrode in a different color from being affected by a turn-on operation of the anode in a specific color.

In addition, when a sub-pixel of the specific color functions as an abnormal sub-pixel due to short-circuit between the anode and the cathode, the shield metal blocks a phenomenon in which a brightness increase occurs in a different sub-pixel including a driving gate electrode overlapped with the anode of the abnormal sub-pixel.

Further, the shielding metal can be formed to prevent an electrical coupling due to overlapping of an anode emitting light in a first color and a neighboring driving transistor for a light emitting element in a second color in a predetermined region.

While the aspects of the present disclosure have been described with reference to the accompanying drawings, the present disclosure is not limited to the aspects and may be embodied in various different forms, and those skilled in the art will appreciate that the present disclosure may be embodied in specific forms other than those set forth herein without departing from the technical idea and essential characteristics of the present disclosure. The disclosed aspects are therefore to be construed in all aspects as illustrative and not restrictive.

What is claimed is:

1. A light emitting display comprising:
a first driving transistor and a second driving transistor spaced apart from each other on a substrate;
a first anode connected to the first driving transistor and overlapping with the second driving transistor;
a second anode connected to the second driving transistor; and a shielding metal between the second driving transistor and the first anode,
wherein the shielding metal is connected to a first power line through which a low-level VSS power voltage is transmitted.

2. The light emitting display of claim 1, wherein the second driving transistor includes a gate electrode, an active layer, a source electrode, and a drain electrode, and the gate electrode of the second driving transistor overlaps with the first anode and the shielding metal.

3. The light emitting display of claim 1, wherein the shielding metal is over the first power line.

4. The light emitting display of claim 1, wherein the first power line is parallel to a data line and overlaps with the first anode.

5. The light emitting display of claim 2, wherein the shielding metal is disposed between a first planarization layer and a second planarization layer, and the first planarization layer and the second planarization layer are interposed between the gate electrode and the first anode.

6. The light emitting display of claim 2, wherein the second anode includes a smaller area than the first anode and the shielding metal has an area greater than an overlapping area of the first anode and the gate electrode.

7. The light emitting display of claim 1, further comprising:
a bank exposing light emitting parts of the first anode and the second anode, and overlapping with edges of the first anode and the second anode; and
an organic layer and a cathode provided on the first anode and the second anode of the light emitting parts, and the bank.

8. The light emitting display of claim 1, wherein the first anode and the second anode formed on a same layer, and at least one of the first anode and the second anode includes a reflective electrode.

9. The light emitting display of claim 1, wherein the first anode and the second anode correspond to light emitting parts of different colors.

10. The light emitting display of claim 1, wherein the low-level VSS power voltage is a constant voltage.

11. The light emitting display of claim 1, wherein the first driving transistor and the second driving transistor are P-type transistor.

12. The light emitting display of claim 1, wherein the first driving transistor and the second driving transistor are oxide transistors.

13. A light emitting display comprising:
a first driving transistor and a second driving transistor spaced apart from each other on a substrate;
a first anode connected to the first driving transistor and overlapping with the second driving transistor, the first anode including a blue light emitting part;
a second anode spaced apart from the first anode and connected to the second driving transistor, the second anode including a green light emitting part; and
a conductive material disposed between the second driving transistor and the first anode,
wherein the conductive material is connected to a first power line through which a low-level VSS power voltage is transmitted.

14. The light emitting display of claim 13, wherein the first anode has a larger area than the second anode.

15. The light emitting display of claim 13, wherein the second driving transistor has a gate electrode, an active layer, a source electrode, and a drain electrode, and the gate electrode of the second driving transistor overlaps with the first anode and the conductive material.

16. The light emitting display of claim 13, wherein the conductive material is over to the first power line.

17. The light emitting display of claim 13, wherein the first power line is parallel to a data line and overlaps with the first anode.

18. The light emitting display of claim 15, wherein the conductive material is disposed between a first planarization layer and a second planarization layer, and the first planarization layer and the second planarization layer are interposed between the gate electrode and the first anode.

19. The light emitting display of claim 15, wherein the conductive material has a larger area than an overlapping area of the first anode and the gate electrode.

20. The light emitting display of claim 13, further comprising:

a bank exposing the blue light emitting part and the green light emitting part, and overlapping with edges of the first anode and the second anode; and an organic layer and a cathode provided on the first anode, the second anode, and the bank, wherein the first anode and the second anode are formed on a same layer, and at least one of the first anode and the second anode includes a reflective electrode.

* * * * *